United States Patent
Kim et al.

(10) Patent No.: US 9,236,401 B2
(45) Date of Patent: Jan. 12, 2016

(54) DISPLAY APPARATUS AND METHOD OF MANUFACTURING THE SAME

(71) Applicant: Samsung Display Co., Ltd., Yongin, Gyeonggi-Do (KR)

(72) Inventors: Jae-Neung Kim, Yongin (KR); Yu-Gwang Jeong, Yongin (KR); Sang-Gab Kim, Yongin (KR); Su-Bin Bae, Yongin (KR); Shin-Il Choi, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/195,051

(22) Filed: Mar. 3, 2014

(65) Prior Publication Data

US 2015/0070643 A1 Mar. 12, 2015

(30) Foreign Application Priority Data

Sep. 11, 2013 (KR) ........................ 10-2013-0109216

(51) Int. Cl.
*G02F 1/1343* (2006.01)
*G02F 1/1362* (2006.01)
*H01L 27/12* (2006.01)

(52) U.S. Cl.
CPC ...... *H01L 27/1225* (2013.01); *G02F 1/134309* (2013.01); *G02F 1/136213* (2013.01); *H01L 27/1248* (2013.01); *H01L 27/1255* (2013.01); *H01L 27/1259* (2013.01)

(58) Field of Classification Search
CPC ............ H01L 27/1225; H01L 27/1248; H01L 27/1255; H01L 27/1259; G02F 1/136213; G02F 1/134309
See application file for complete search history.

(56) References Cited

U.S. PATENT DOCUMENTS

| | | | |
|---|---|---|---|
| 2009/0167975 A1* | 7/2009 | Lee et al. | 349/43 |
| 2009/0302325 A1 | 12/2009 | Huh et al. | |
| 2011/0068337 A1 | 3/2011 | Choi et al. | |
| 2012/0033152 A1* | 2/2012 | Ha et al. | 349/43 |
| 2012/0038874 A1* | 2/2012 | Kim et al. | 349/138 |
| 2012/0056184 A1 | 3/2012 | Park | |
| 2012/0119206 A1 | 5/2012 | Wang et al. | |
| 2013/0341588 A1* | 12/2013 | Jeon et al. | 257/13 |
| 2014/0061635 A1* | 3/2014 | Liu | 257/43 |

FOREIGN PATENT DOCUMENTS

| | | |
|---|---|---|
| KR | 1020080113967 A | 12/2008 |
| KR | 1020090127677 A | 12/2009 |
| KR | 1020110032360 A | 3/2011 |
| KR | 1020120051942 A | 5/2012 |

\* cited by examiner

*Primary Examiner* — Dennis Y Kim
(74) *Attorney, Agent, or Firm* — Cantor Colburn LLP (57) ABSTRACT

A display apparatus includes: a substrate defining transistor and wiring areas; a thin film transistor in the transistor area and including a gate electrode, an active layer, and source and drain electrodes; an etch prevention layer in the transistor area, absent in the wiring area and covering the active layer, and first and second contact holes defined in the etch prevention layer and through which the active layer is electrically coupled to the source and drain electrodes; a first wiring layer in the wiring area; a first insulating layer which covers the gate electrode and the first wiring layer, and a third contact hole defined in the first insulating layer in the wiring area and exposing the first wiring layer; and a second wiring layer on the first insulating layer and in the wiring area, and electrically coupled to the first wiring layer via the third contact hole.

17 Claims, 7 Drawing Sheets

DISPLAY APPARATUS AND METHOD OF MANUFACTURING THE SAME

This application claims priority to Korean Patent Application No. 10-2013-0109216, filed on Sep. 11, 2013, and all the benefits accruing therefrom under 35 U.S.C. §119, the disclosure of which is incorporated herein in its entirety by reference.

BACKGROUND

1. Field

One or more exemplary embodiment of the invention relates to a display apparatus and a method of manufacturing the display apparatus.

2. Description of the Related Art

Flat panel display apparatuses such as organic light-emitting display apparatuses, liquid crystal display apparatuses, etc. are manufactured on a substrate on which are disposed patterns including at least one thin film transistor ("TFT") and capacitor, and lines connecting the TFT and capacitor.

SUMMARY

One or more exemplary embodiment of the invention includes a display apparatus and a method of manufacturing the display apparatus.

According to one or more exemplary embodiment of the invention, a display apparatus includes a backplane panel. The backplane panel includes: a substrate on which a transistor area and a wiring area are defined; a thin film transistor in the transistor area of the substrate, and including a gate electrode, an active layer, a source electrode and a drain electrode; an etch prevention layer which is in the transistor area and absent in the wiring area, and covers the active layer, and first and second contact holes defined in the etch prevention layer in the transistor area and through which the active layer is electrically coupled to the source electrode and the drain electrode, respectively; a first wiring layer in the wiring area of the substrate; a first insulating layer which is on the substrate and covers the gate electrode and the first wiring layer, and a third contact hole which is defined in the first insulating layer in the wiring area and exposes the first wiring layer; and a second wiring layer which is on the first insulating layer and in the wiring area of the substrate, and electrically coupled to the first wiring layer via the third contact hole.

The etch prevention layer may have the same pattern as that of the active layer.

The etch prevention layer may be directly on the active layer.

The second wiring layer may be directly on the first insulating layer.

The display apparatus may further include: a second insulating layer between the first insulating layer and the second wiring layer.

The gate electrode and the first wiring layer may be in different layers.

The display apparatus may further include: a buffer layer between the gate electrode and the first wiring layer.

The second wiring layer may include a same material as that of the source electrode and the drain electrode.

The display apparatus may further include: a pixel electrode electrically coupled to the source electrode or the drain electrode; an intermediate layer on the pixel electrode and including an organic emission layer; and a counterpart electrode on the intermediate layer.

The display apparatus may further include: a first pixel electrode electrically coupled to the source electrode or the drain electrode; a liquid crystal layer on the first pixel electrode; and a second pixel electrode on the liquid crystal layer and facing the first pixel electrode.

The active layer may include an oxide semiconductor.

According to one or more exemplary embodiment of the invention, a method of manufacturing a display apparatus includes providing a backplane panel, the providing the backplane panel including: forming a first wiring layer in a wiring area of a substrate; forming a gate electrode in a transistor area of the substrate; forming a first insulating layer, a semiconductor layer and an etch prevention material layer to cover the gate electrode and the first wiring layer; etching the semiconductor layer and the etch prevention material layer in the wiring area, to form an active layer and an etch prevention layer on the gate electrode in the transistor area; simultaneously forming first and second contact holes in the etch prevention layer in the transistor area by patterning the etch prevention layer on the gate electrode, and a third contact hole in the first insulating layer in the wiring area by patterning the first insulating layer on the first wiring layer; and forming a source electrode and a drain electrode in the transistor area, and a second wiring layer in the wiring area, by forming and patterning a metal.

The etching the semiconductor layer and the etch prevention material layer may include: forming the active layer by removing the semiconductor layer in the wiring area while maintaining the semiconductor layer on the gate electrode in the transistor area, and forming the etch prevention layer by removing the etch prevention material layer in the wiring area while maintaining the etch prevention material layer on the gate electrode in the transistor area.

The semiconductor layer and the etch prevention material layer may be simultaneously etched so that the active layer and the etch prevention layer have the same pattern.

The method may further include: forming a buffer layer in the wiring area and the transistor area, to cover the first wiring layer.

The gate electrode may be in a different layer than that of the first wiring layer, and the buffer layer may be between the gate electrode and the first wiring layer.

The simultaneously forming the first through third contact holes may include: forming the first and second contact holes by patterning the etch prevention layer on the gate electrode and forming the third contact hole by patterning the buffer layer and the first insulating layer on the first wiring layer.

The method may further include: forming a second insulating layer to cover the etch prevention layer of the transistor area and the first insulating layer of the wiring area.

The semiconductor layer may include an oxide semiconductor.

The method may further include: forming a second insulating layer on the substrate.

In the simultaneously forming the first through third contact holes, the first and second contact holes may be formed to pass through the etch prevention layer and the second insulating layer on the gate electrode, and the third contact hole is formed to pass through the first and second insulating layers on the first wiring layer.

BRIEF DESCRIPTION OF THE DRAWINGS

These and/or other features will become apparent and more readily appreciated from the following description of the exemplary embodiments, taken in conjunction with the accompanying drawings of which.

DETAILED DESCRIPTION

Reference will now be made in detail to exemplary embodiments, examples of which are illustrated in the accompanying drawings, wherein like reference numerals refer to the like elements throughout. In this regard, the invention may have different forms and should not be construed as being limited to the descriptions set forth herein. Accordingly, the exemplary embodiments are merely described below, by referring to the figures, to explain features of the invention. As used herein, the term "and/or" includes any and all combinations of one or more of the associated listed items. As used herein, connected may refer to elements being physically and/or electrically connected to each other.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" another layer, region or component, it can be directly or indirectly on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following exemplary embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain exemplary embodiment may be implemented differently, a specific process order may be performed differently from the described order. For example, two consecutively described processes may be performed substantially at the same time or performed in an order opposite to the described order.

Hereinafter, the invention will be described in detail with reference to the accompanying drawings.

Figure 1:
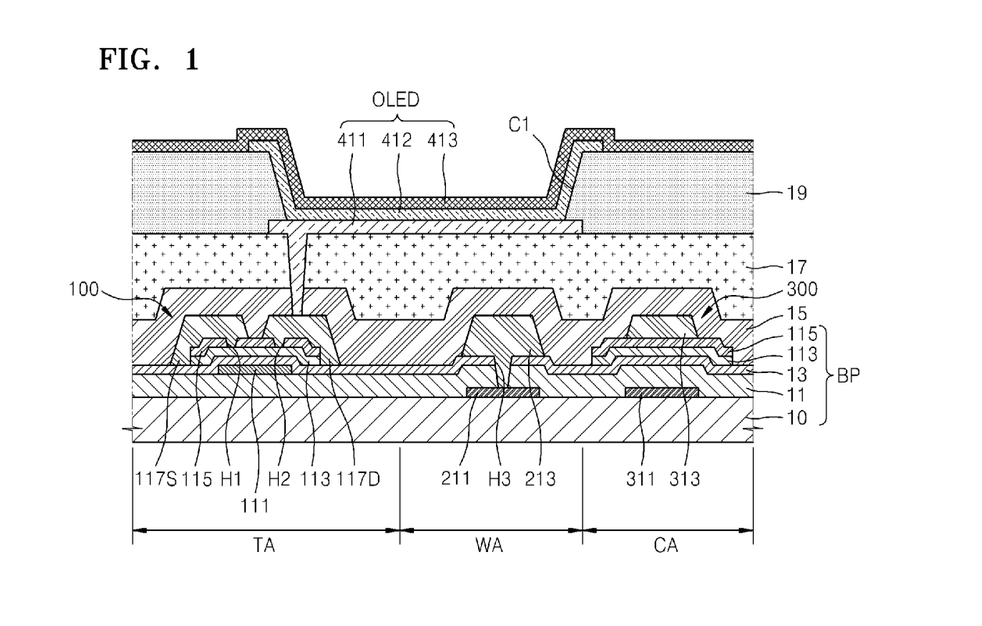
FIG. 1 is a cross-sectional view illustrating an exemplary embodiment of a display apparatus, according to the invention.

FIG. 1 is a cross-sectional view illustrating an exemplary embodiment of a display apparatus, according to the invention.

Referring to FIG. 1, a transistor area TA including at least one thin film transistor ("TFT") 100, a wiring area WA including wirings, and a capacitor area CA including at least one capacitor 300 are defined on a substrate 10 of an exemplary embodiment of the display apparatus according to the invention. The wirings of the wiring area WA may connect the TFT 100 and the capacitor 300 to each other, but the invention is not limited thereto. The display apparatus may include an organic light-emitting device ("OLED") which is formed on a backplane panel BP for the display apparatus.

The substrate 10 may be a transparent glass substrate. According to another exemplary embodiment, the substrate 10 may be a plastic substrate including polyethylene terephthalate ("PET"), polyethylene naphthalate ("PEN"), or polyimide, etc.

A buffer layer 11 may reduce or effectively prevent impure elements from penetrating into the substrate 10 and planarize a surface of the substrate 10. The buffer layer 11 may have a single layer structure or a multilayer structure including an inorganic material such as silicon nitride (SiNx) and/or silicon oxide (SiOx). In one exemplary embodiment, for example, the buffer layer 11 may have a double layer structure including SiOx and SiNx, and have a cross-sectional thickness of about 4500 angstroms (Å).

The TFT 100 is disposed in the transistor area TA of the substrate 10. The TFT 100 of the transistor area TA of FIG. 1 may be a driving TFT that is electrically coupled to the OLED to drive the OLED, but is not limited thereto.

The TFT 100 is a bottom gate type and may include a gate electrode 111, an active layer 113, and a source electrode 117S and a drain electrode 117D that are connected to the active layer 113. A first insulating layer 13 may be disposed between the gate electrode 111 and the active layer 113, as a gate insulating layer. The first insulating layer 13 may include an inorganic material such as silicon dioxide ($SiO_2$), silicon nitride ($SiN_x$), silicon oxynitride (SiON), aluminium oxide ($Al_2O_3$), titanium oxide ($TiO_2$), tantalum oxide ($Ta_2O_5$), hafnium oxide ($HfO_2$), zirconium oxide ($ZrO_2$), barium strontium titanate ("BST"), or lead zirconium titanate ("PZT"), and may have a cross-sectional thickness of about 1200 Å.

The gate electrode 111 may be disposed at a lower portion of the active layer 113 and may include at least one metal selected from aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu).

The active layer 113 may include an oxide semiconductor. If the active layer 113 includes amorphous silicon, implementing a driving circuit operating at high speed may be difficult, since mobility of the amorphous silicon is relatively low. If the active layer 113 includes polysilicon, although mobility thereof is relatively high, since a threshold voltage thereof is not uniform, there is a problem in that a compensation circuit is added. A method of manufacturing a TFT using lower temperature polysilicon ("LTPS") involves costly processing such as laser heat treatment, and thus there are problems in that equipment investment and management cost are relatively high and application to a substrate with a large area is difficult. To resolve these problems, one or more exemplary embodiment of the display apparatus according to the invention may use an oxide semiconductor as the active layer 113.

In one exemplary embodiment, for example, the active layer 113 may include at least one of indium gallium zinc oxide ("IGZO") and indium tin zinc oxide ("ITZO"), and have a cross-sectional thickness of about 500 Å. Alternatively, the active layer 113 may include an oxide including at least one material selected from 12, 13, and 14 Group metal elements such as zinc (Zn), indium (In), gallium (Ga), tin (Sn), cadmium (Cd), germanium (Ge) and hafnium (Hf).

An etch prevention layer 115 may be disposed on the active layer 113 and may protect the active layer 113 when the source electrode 117S and the drain electrode 117D are formed in a method of manufacturing the display apparatus. In one exemplary embodiment, for example, the etch prevention layer 115 may be disposed directly on the active layer 113, but the invention is not limited thereto. The etch prevention layer 115 and the active layer 113 may include materials with different etch selectivity. In this regard, the different etch selectivity means that the active layer 113 is not etched when the etch prevention layer 115 is etched. In one exemplary embodiment, for example, the etch prevention layer 115 may include a material that is low in hydrogen and does not change an oxide characteristic of the active layer 113, for example, SiNx or AlOx. The etch prevention layer 115 may have a cross-sectional thickness of about 500 Å. First and second contact holes H1 and H2 may be defined in the etch prevention layer 115 and expose an upper surface of the active layer 113.

In an exemplary embodiment of manufacturing a display apparatus, the etch prevention layer 115 may be patterned along with (or may be simultaneously patterned with) the active layer 113 by using a same mask, as will be described later with reference to FIGS. 2C and 2D, and thus the etch prevention layer 115 may have substantially a same pattern as that of the active layer 113.

The source electrode 117S and the drain electrode 117D may be physically and/or electrically coupled to the active layer 113 through the first and second contact holes H1 and H2 defined in the etch prevention layer 115, respectively. The source electrode 117S and the drain electrode 117D may include at least one metal selected from aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu).

A first wiring layer 211, and a second wiring layer 213 that is physically and/or electrically coupled to the first wiring layer 211, may be disposed in the wiring area WA. The first wiring layer 211 may be disposed in and/or on a layer different from the gate electrode 111, with the buffer layer 11 interposed between the first wiring layer 211 and the gate electrode 111. In one exemplary embodiment, for example, the first wiring layer 211 may be disposed below the buffer layer 11 and the gate electrode 111 may be disposed on (e.g., above) the buffer layer 11. The buffer layer 11 and the first insulating layer 13 may be disposed between the first wiring layer 211 and the second wiring layer 213.

The second wiring layer 213 may include a same material as that of the source electrode 117S and the drain electrode 117D of the TFT 100, and may be in a same layer as that of the source electrode 117S and the drain electrode 117D. In one exemplary embodiment, for example, the second wiring layer 213, the source electrode 117S and the drain electrode 117D may include at least one metal selected from aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu).

A third contact hole H3 is defined in the buffer layer 11 and the first insulating layer 13. The first wiring layer 211 and the second wiring layer 213 may be electrically coupled to each other through the third contact hole H3 that passes through the buffer layer 11 and the first insulating layer 13, and thus a signal used to operate the display apparatus moves through the electrically coupled first wiring layer 211 and second wiring layer 213. In the illustrated exemplary embodiment, the first wiring layer 211 and the second wiring layer 213 may be coupled to a gate line to receive an electrical signal, but the invention is not limited thereto. According to another exemplary embodiment, the first wiring layer 211 and the second wiring layer 213 may be coupled to a data line to receive an electrical signal.

The capacitor 300 in the capacitor area CA may include a lower electrode 311 and an upper electrode 313. The lower electrode 311 may include a same material as that of the first wiring layer 211 and may be in a same layer as that of the first wiring layer 211. The upper electrode 313 may include a same material as that of the second wiring layer 213, the source electrode 117S and the drain electrode 117D of the TFT 100 and may be in a same layer as that of the second wiring layer 213, the source electrode 117S and the drain electrode 117D.

In the illustrated exemplary embodiment, the buffer layer 11, the first insulating layer 13, the active layer 113 and the etch prevention layer 115 are disposed between the lower electrode 311 and the upper electrode 313, but the invention is not limited thereto. According to another exemplary embodiment, the buffer layer 11 and the first insulating layer 13, excluding the active layer 113 and the etch prevention layer 115, may be disposed between the lower electrode 311 and the upper electrode 313.

According to the illustrated exemplary embodiment, the etch prevention layer 115 is disposed in the transistor area TA and the capacitor area CA but is not disposed in the wiring area WA. In an exemplary embodiment of a method of manufacturing a display apparatus, a process of forming the first and second contact holes H1 and H2, and a process of forming the third contact hole H3, may be performed in a same process. The etch prevention layer 115 is not included in the wiring area WA to reduce or effectively prevent damage to or deformation of a surface of the active layer 113 included in the transistor area TA during such a process. This will be described in detail with reference to FIG. 4 below.

Figure 4:
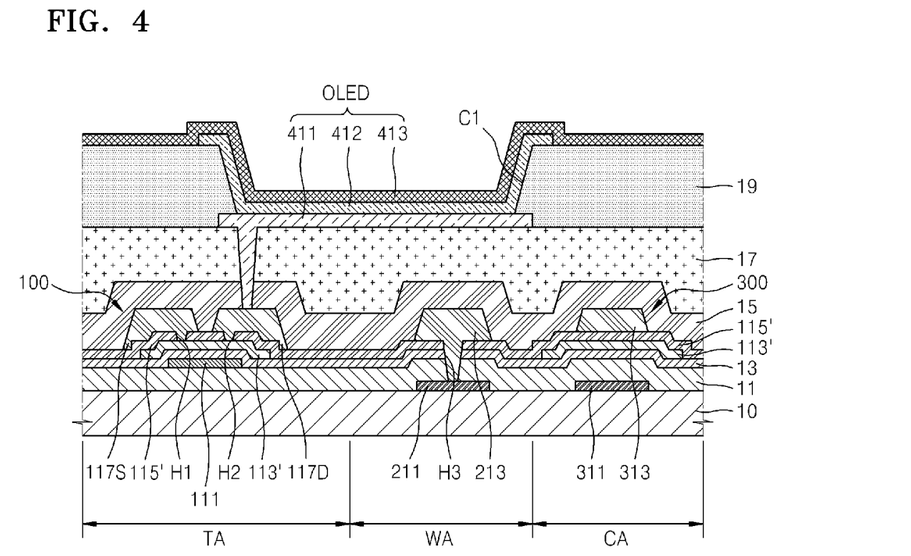
FIG. 4 is a cross-sectional view illustrating a comparative example of a display apparatus.

FIG. 4 is a cross-sectional view illustrating a comparative example of a display apparatus. If the comparative example of the display apparatus of FIG. 4 further includes an etch prevention layer 115' between the first and second wiring layers 211 and 213 in the wiring area WA, the third contact hole H3 is defined in the buffer layer 11, the first insulating layer 13 and the etch prevention layer 115' such as by etching the buffer layer 11, the first insulating layer 13 and the etch prevention layer 115' to form the third contact hole H3. That is, cross-sectional thicknesses of layers etched to form the third contact hole H3 are greater than those of layers etched to form the first and second contact holes H1 and H2 in the transistor area TA. Thus, there are problems in that, in a process of simultaneously forming the first through third contact holes H1, H2 and H3, an etch prevention layer 115' disposed in the transistor area TA is over-etched, an upper portion of the active layer 113 included in the transistor area TA is seriously damaged or deformed due to the over-etch, a contact resistance between the source electrode 117S and the drain electrode 117D and the active layer 113 increases, and reliability of the TFT 110 deteriorates.

To resolve the problems, although a method of increasing a thickness of the active layer 113' may be considered, there are limitations in increasing the overall thickness of the display apparatus and prevention of the reliability deterioration of the TFT 100 due to the increase in the thickness of the active layer 113'. Another method uses a material having an etch selectivity of about 30:1 as the etch prevention layer 115' and the active layer 113' that are disposed in the transistor area TA. However, there are problems with the use of the material in that cost, time and process increase.

Referring back to FIG. 1, according to an exemplary embodiment of the invention, the etch prevention layer 115 is not included and absent in the wiring area WA, and thus the etch prevention layer 115 of the transistor area TA is not over-etched in a process of forming the first through third contact holes H1, H2 and H3, thereby preventing and minimizing serious damage to or deformation of an upper portion of the active layer 113 of the TFT 100.

Referring again to FIG. 1, an interlayer insulating layer 15 may be disposed to cover the source electrode 117S, the drain electrode 117D, the second wiring layer 213 and the upper electrode 313. A planarization layer 17 may be disposed on the interlayer insulating layer 15.

The interlayer insulating layer 15 may include an inorganic material such as $SiO_2$, $SiN_x$, SiON, $Al_2O_3$, $TiO_2$, $Ta_2O_5$, $HfO_2$, $ZrO_2$, BST or PZT. The planarization layer 17 may include an organic material having an excellent planarization characteristic. In one exemplary embodiment, for example, the planarization layer 17 may include a photosensitive organic layer. Alternatively, the planarization layer 17 may include an inorganic layer, or a combination of inorganic and organic layers.

The OLED may be disposed on the planarization layer 17. The OLED may include a pixel electrode 411 that is disposed in an opening C1 defined by a pixel defining layer 19, a counterpart electrode 413 facing the pixel electrode 411, and an intermediate layer 412 disposed between the pixel electrode 411 and the counterpart electrode 413 and including an organic emission layer.

When the pixel electrode 411 is used as an anode electrode, the pixel electrode 411 includes a layer including a metal oxide having a relatively high absolute value of a work function, such as indium tin oxide ("ITO"), indium zinc oxide ("IZO"), ZnO, or the like. When the pixel electrode 411 is used as a cathode electrode, the pixel electrode 411 may include a relatively high conductive metal having a relatively low absolute value of the work function, such as Ag, Mg, Al, Pt, Pd, Au, Ni, Nd, Ir, Cr, Li, Ca, or the like. The counterpart electrode 413 is used as a cathode electrode when the pixel electrode 411 is used as an anode electrode, and the counterpart electrode 413 is used as an anode electrode when the pixel electrode 411 is used as a cathode electrode.

The intermediate layer 412 may have a single-layer or multilayer structure in which one or more functional layers of a hole transport layer ("HTL"), a hole injection layer ("HIL"), an electron transport layer ("ETL") and an electron injection layer ("EIL") are stacked, in addition to the organic emission layer ("EML").

When the display apparatus is a top emission structure, the pixel electrode 411 may be a reflective electrode, and the counterpart electrode 413 may be a phototransmissive electrode. In an exemplary embodiment where the counterpart electrode 413 is a phototransmissive electrode, the counterpart electrode 413 may include a half-transmissive reflective film as a thin film of Ag, Mg, Al, Pt, Pd, Au, Ni, Nd, Ir, Cr, Li, Ca, or the like, or a phototransmissive metal oxide, such as ITO, IZO, ZnO, or the like.

A method of manufacturing a display apparatus according to the invention will be described with reference to FIGS. 2A through 2I below.

FIGS. 2A through 2I are schematic cross-sectional views for explaining an exemplary embodiment of a method of manufacturing a display apparatus, according to the invention.

Figure 2A:
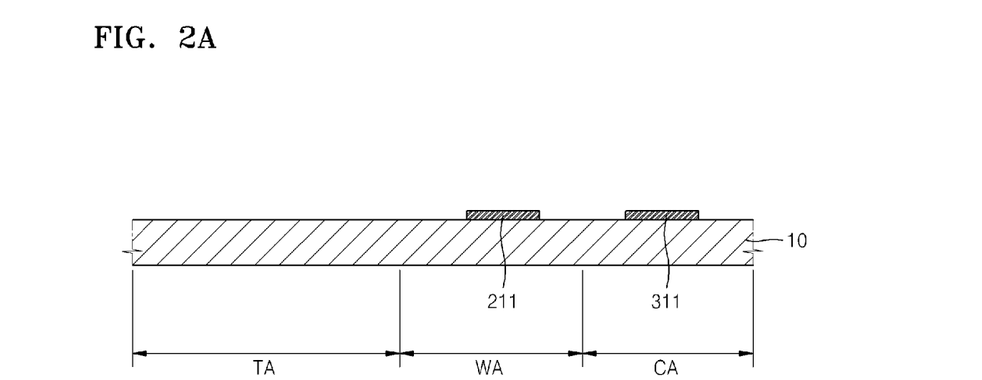
FIGS. 2A through 2I are schematic cross-sectional views for explaining an exemplary embodiment of a method of manufacturing a display apparatus, according to the invention.

FIG. 2A is a schematic cross-sectional view of the display apparatus in an exemplary embodiment of a first mask process, according to the invention.

Referring to FIG. 2A, a first metal layer (not shown) is formed and patterned, and thus the first wiring layer 211 and the lower electrode 311 are simultaneously formed. The first metal layer may include at least one metal selected from aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu).

Figure 2B:
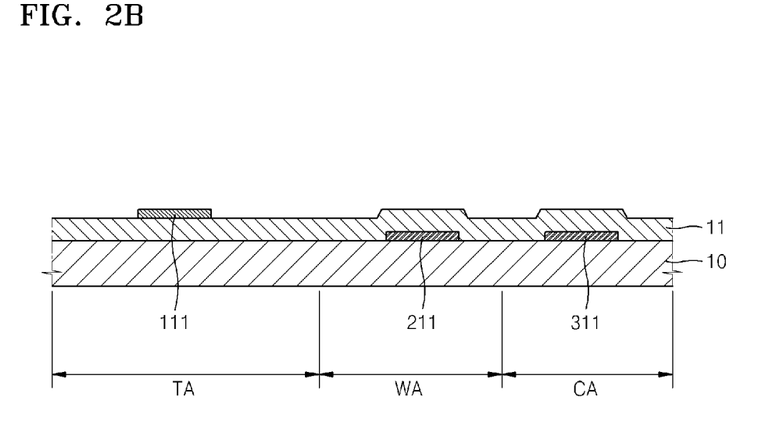

FIG. 2B is a schematic cross-sectional view of the display apparatus in an exemplary embodiment of a second mask process, according to the invention.

Referring to FIG. 2B, the buffer layer 11 is formed, and then a second metal layer (not shown) is formed on the buffer layer 11 and patterned. The gate electrode 111 is formed in the transistor area TA as a result of patterning. The buffer layer 11 may have a single layer structure or a multilayer structure including an inorganic material such as SiNx and/or silicon oxide SiOx.

The second metal layer may include at least one selected from aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu).

In the illustrated exemplary embodiment, the gate electrode 111 is formed after the first wiring layer 211 and the lower electrode 311 are formed with reference to FIGS. 2A and 2B, but the invention is not limited thereto. In one exemplary embodiment, for example, the first wiring layer 211, the lower electrode 311 and the gate electrode 111 may be simultaneously formed in a same mask process, and may be in a same layer. In this regard, the buffer layer 11 may be formed above or below the first wiring layer 211, the lower electrode 311 and the gate electrode 111.

Figure 2C:
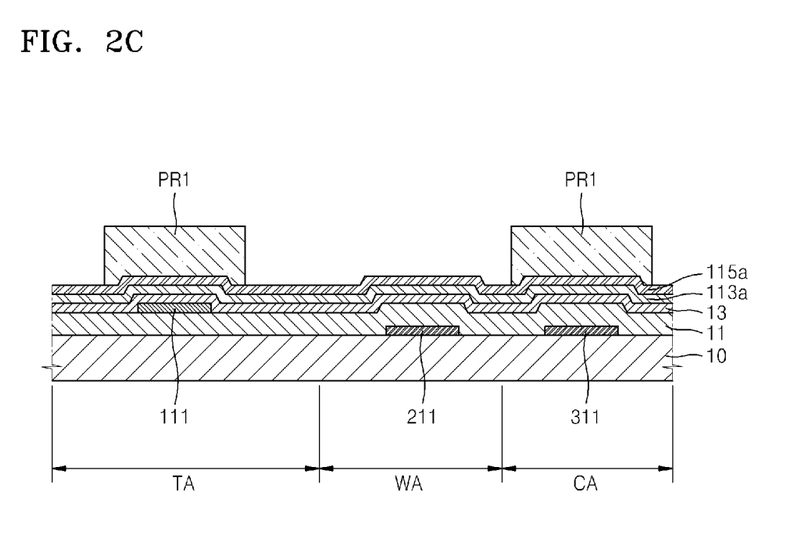
Figure 2D:
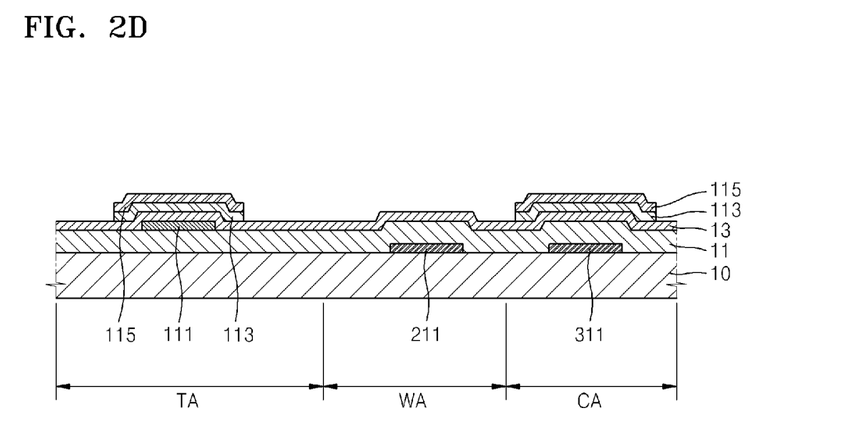

FIGS. 2C and 2D are schematic cross-sectional views of the display apparatus in an exemplary embodiment of a third mask process, according to the invention.

Referring to FIG. 2C, the first insulating layer 13, a semiconductor layer 113a, and an etch prevention material layer 115a are sequentially formed, are coated with a photoresist material, and are patterned. As a result of patterning, a first photoresist PR1 is formed on the transistor area TA and the capacitor area CA.

The first insulating layer 13 may include an inorganic material such as $SiO_2$, $SiN_x$, SiON, $Al_2O_3$, $TiO_2$, $Ta_2O_5$, $HfO_2$, $ZrO_2$, BST or PZT, and may have a cross-sectional thickness of about 1200 Å. The semiconductor layer 113a may include an oxide including at least one material selected from 12, 13, and 14 Group metal elements such as Zn, In, Ga, Sn, Cd, Ge and Hf. In one exemplary embodiment, for example, the active layer 113a may include at least one of IGZO and ITZO, and have a cross-sectional thickness of about 500 Å. The etch prevention material layer 115a may include an inorganic material, such as SiNx or AlOx, that is relatively low in hydrogen and does not change an oxide characteristic of the active layer 113a in such a manner that the etch prevention material layer 115a may have a cross-sectional thickness of about 500 Å.

Referring to FIG. 2D, the active layer 113 and the etch prevention layer 115 may be formed by patterning the active layer 113a and the etch prevention material layer 115a that are formed in the transistor area TA, by using the first photoresist PR1 as a mask. The active layer 113 and the etch prevention layer 115 may be patterned by dry etching. Alternatively, the active layer 113 and the etch prevention layer 115 may be patterned by wet etching.

Likewise, the active layer 113a and the etch prevention layer 115a that are formed in the capacitor area CA may be wet or dry etched by using the first photoresist PR1 as the mask. The first photoresist PR1 is not formed and absent in the wiring area WA, and thus the active layer 113a and the etch prevention layer 115a that are disposed in the wiring area WA are completely removed.

The active layer 113a and the etch prevention layer 115a are simultaneously patterned in a same process using the first photoresist PR1 as the mask, and thus the active layer 113 and the etch prevention layer 115 that are formed in the transistor area TA, or in the transistor area TA and the capacitor area CA may have same patterns. In one exemplary embodiment, for example, the active layer 113 and the etch prevention layer 115 that are formed in the transistor area TA and/or in the capacitor area CA may have same sizes and shapes, such as taken in a plan view.

In the illustrated exemplary embodiment, the first photoresist PR1 is formed on the transistor area TA and the capacitor area CA, and the active layer 113a and the etch prevention layer 115a are patterned by using the first photoresist PR1 as the mask, but the invention is not limited thereto.

According to another exemplary embodiment, the first photoresist PR1 may be formed only in the transistor area TA, and the active layer 113a and the etch prevention layer 115a are patterned by using the first photoresist PR1 as the mask. Where the first photoresist PR1 is formed only in the transistor area TA (and not in the capacitor area CA), the active layer 113 and the etch prevention layer 115 are formed by patterning the active layer 113a and the etch prevention layer 115a disposed only in the transistor area TA, and the active layer 113a and the etch prevention layer 115a that are disposed in the wiring area WA and the capacitor area CA are completely removed.

The first photoresist PR1 may be removed.

Figure 2E:
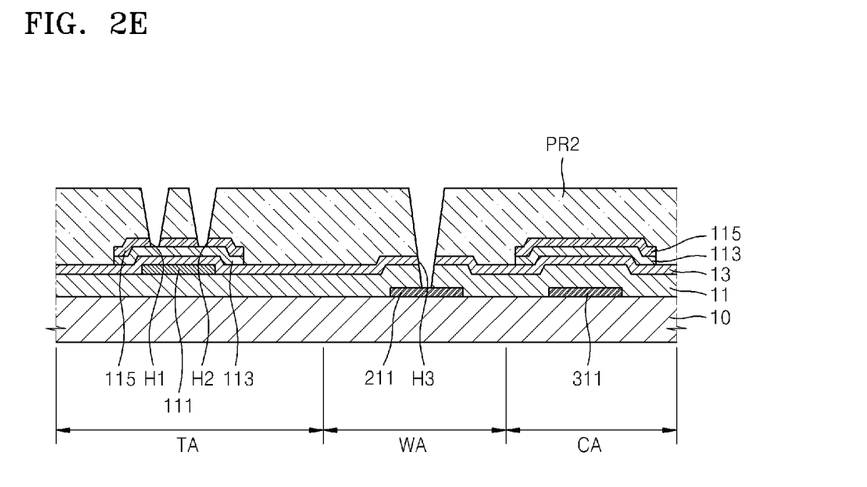
Figure 2F:
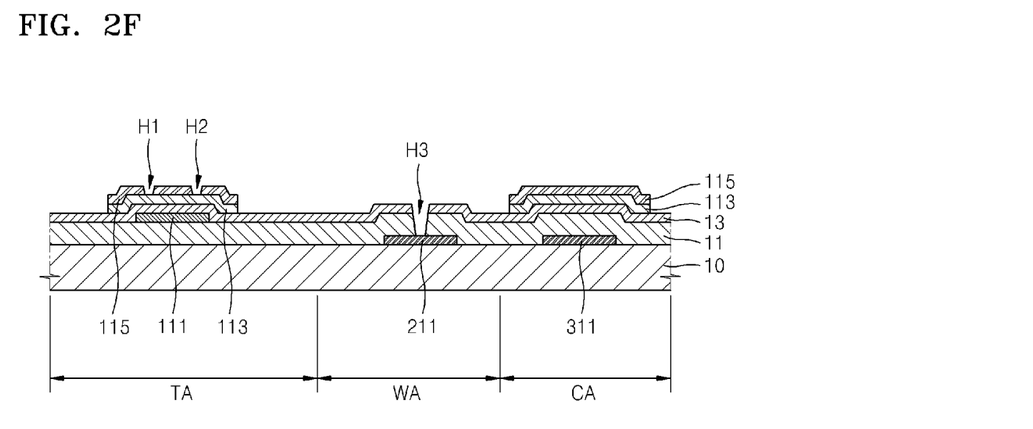

FIGS. 2E and 2F are schematic cross-sectional views of the display apparatus in an exemplary embodiment of a fourth mask process, according to the invention.

Referring to FIGS. 2E and 2F, a second photoresist PR2 is formed and patterned, and then the first through third contact holes H1, H2 and H3 are formed. In one exemplary embodiment, for example, the first and second contact holes H1 and H2 that expose the active layer 113 are formed by patterning the etch prevention layer 115 disposed in the transistor area TA, and the third contact hole H3 that exposes the first wiring layer 211 is formed by patterning the first insulating layer 13 and the buffer layer 11 that are disposed in the wiring area WA. The first through third contact holes H1, H2 and H3 may be patterned by dry or wet etching.

The first through third contact holes H1, H2 and H3 are simultaneously formed in a same process. Since the active layer 113 and the etch prevention layer 115 are not disposed in the wiring area WA during the third mask process, although an etch process for forming the third contact hole H3 is performed during a predetermined period of time, as described above, damage to or deformation of the active layer 113 included in the transistor area TA may be prevented or minimized.

The second photoresist PR2 may be removed.

Figure 2G:
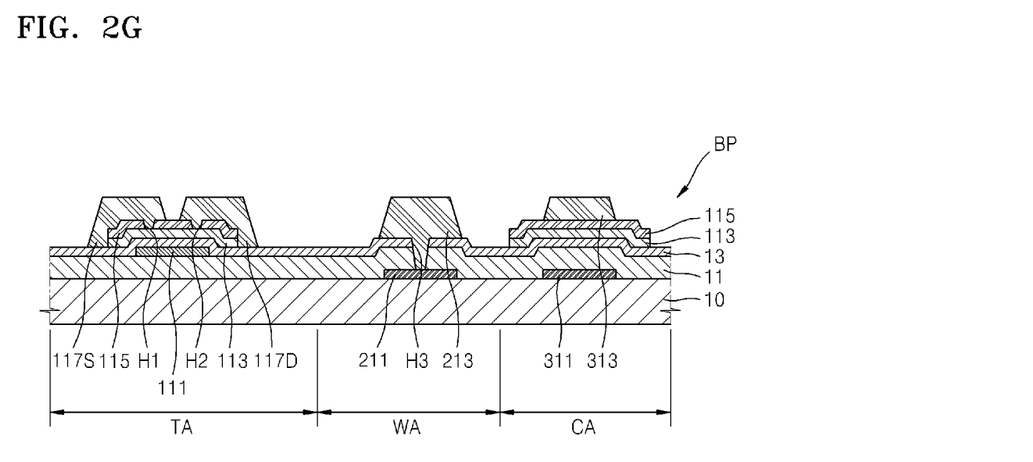

FIG. 2G is a schematic cross-sectional view of the display apparatus in an exemplary embodiment of a fifth mask process, according to the invention.

Referring to FIG. 2G, a third metal layer (not shown) is formed and patterned and then, the source electrode 117S, the drain electrode 117D, the second wiring layer 213 and the upper electrode 313 are simultaneously formed.

The third metal layer may have a layer including at least one or more metal selected from aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu) and alloys of these.

Figure 2H:
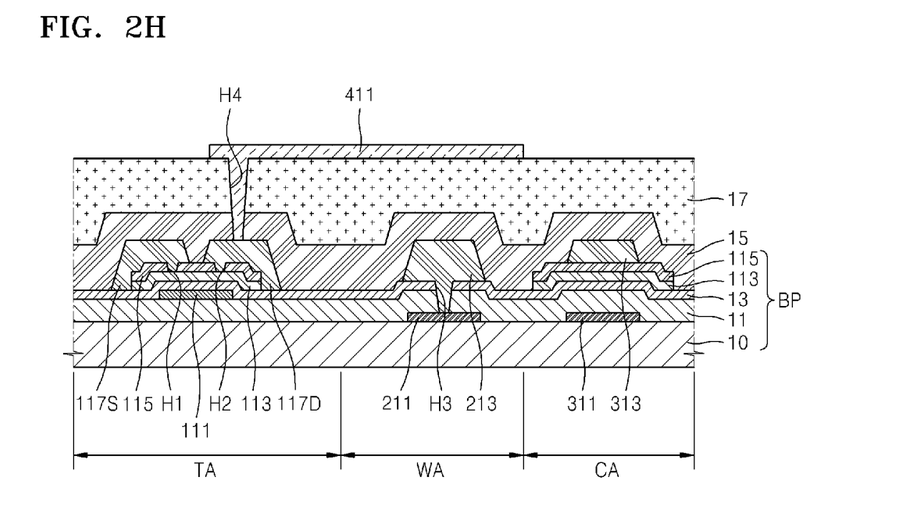

FIG. 2H is a schematic cross-sectional view of the display apparatus in an exemplary embodiment of sixth and seventh mask processes, according to an embodiment of the invention.

Referring to FIG. 2H, the interlayer insulating layer 15 and the planarization layer 17 are formed and patterned, and thus a fourth contact hole H4 that exposes one of the source electrode 117S and the drain electrode 117D is formed in the interlayer insulating layer 15 and the planarization layer 17 (the sixth mask process).

The interlayer insulating layer 15 may include an inorganic material such as $SiO_2$, $SiN_x$, SiON, $Al_2O_3$, $TiO_2$, $Ta_2O_5$, $HfO_2$, $ZrO_2$, BST or PZT. The planarization layer 17 may include a photosensitive organic layer having an excellent planarization characteristic. Alternatively, the planarization layer 17 may include an inorganic layer, or a combination of inorganic and organic layers.

In the illustrated exemplary embodiment, both the interlayer insulating layer 15 and the planarization layer 17 are formed on the backplane panel BP, but the invention is not limited thereto. According to another exemplary embodiment, only the planarization layer 17 may be formed and the interlayer insulating layer 15 may be omitted.

Thereafter, an electrode material (not shown) is formed and patterned and thus the pixel electrode 411 is formed (the seventh mask process). The pixel electrode 411 may be electrically coupled to one of the source electrode 117S and the drain electrode 117D through the fourth contact hole H4.

Figure 2I:
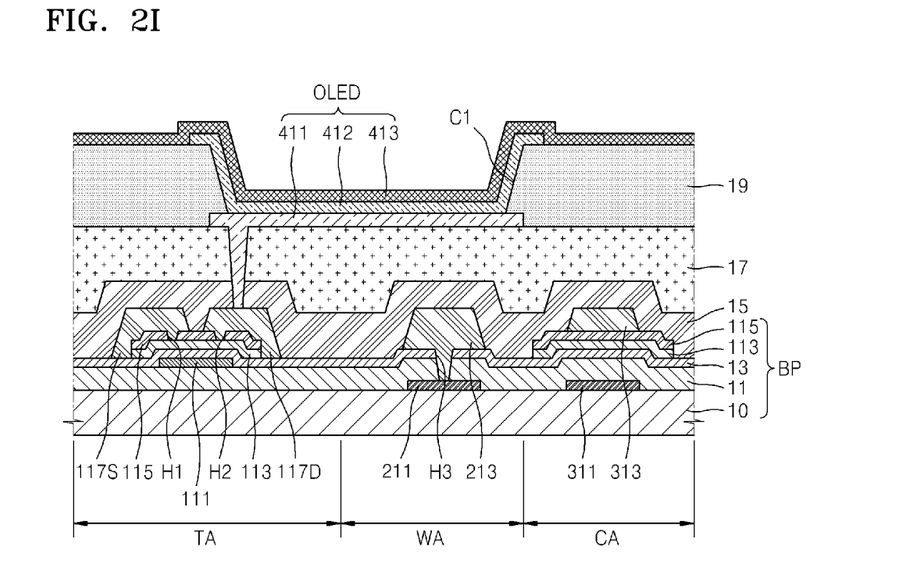

FIG. 2I is a schematic cross-sectional view of the display apparatus in an exemplary embodiment of an eighth mask process, according to the invention.

Referring to FIG. 2I, the pixel defining layer 19 is formed and patterned and thus the opening C1 that exposes the pixel electrode 411 is formed in the pixel defining layer 19. Thereafter, the intermediate layer 412 including the organic emission layer is formed and the counterpart electrode 413 is formed in the opening C1.

As described above, a backplane panel BP for a display apparatus, which is a structure implemented through the first through fifth mask processes described with reference to FIGS. 2A through 2G, may be used in an organic light-emitting display apparatus and a liquid crystal display apparatus. In the illustrated exemplary embodiment, the OLED is formed on the backplane panel BP, but the invention is not limited thereto. According to another embodiment, the liquid crystal display device may be formed on the backplane panel BP. Another exemplary embodiment in which the liquid crystal display device is formed on the backplane panel BP will be described later with reference to FIG. 5.

Figure 3:
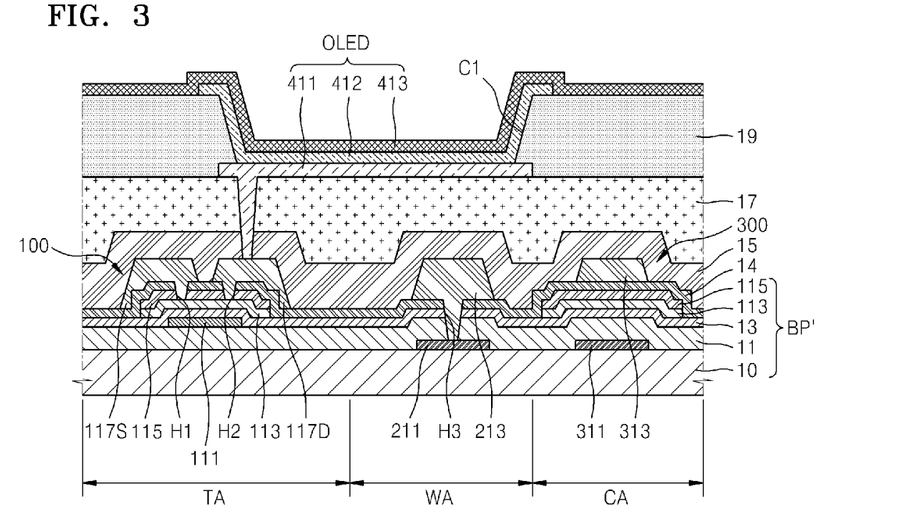
FIG. 3 is a cross-sectional view illustrating another exemplary embodiment of a display apparatus, according to the invention.

FIG. 3 is a cross-sectional view illustrating another exemplary embodiment of a display apparatus, according to the invention. Like reference numerals refer to the like elements below. Differences between the display apparatus of FIG. 3 and the display apparatus described with reference to FIGS. 1 through 2I are described.

Referring to FIG. 3, a backplane panel BP' further includes a second insulating layer 14 that covers the etch prevention layer 115 and the first insulating layer 13. In one exemplary embodiment, for example, the second insulating layer 14 may be formed to cover the etch prevention layer 115 disposed in the transistor area TA, the first insulating layer 13 disposed in the wiring area WA, and the etch prevention layer 115 disposed in the capacitor area CA. The second insulating layer 14 may include an inorganic material such as $SiO_2$, $SiN_x$, SiON, $Al_2O_3$, $TiO_2$, $Ta_2O_5$, $HfO_2$, $ZrO_2$, BST or PZT.

Since the display apparatus according to the exemplary embodiment in FIG. 3 further includes the second insulating layer 14, although a cross-sectional thickness of the etch prevention layer 115 is smaller than that of the etch prevention layer 115 described with reference to FIG. 1, damage to or deformation of the active layer 113 may be prevented or minimized.

The second wiring layer 14 may prevent or minimize generation of a parasitic capacitance between elements of the display apparatus in the wiring area WA. In one exemplary embodiment, for example, if a distance between the first wiring layer 211 and the second wiring layer 213 is smaller than a predetermined reference value, the parasitic capacitance may be generated between a third wiring layer (not shown) passing through and/or between the first wiring layer 211 and the second wiring layer 213. The third wiring layer may include another wiring layer crossing the first wiring layer 211 and the second wiring layer 213. The parasitic capacitance may prevent an electrical current signal passing through the first wiring layer 211, the second wiring layer 213 and the third wiring layer from being transferred. However, in an exemplary embodiment according to the invention, the second insulating layer 14 is further included between the first wiring layer 211 and the second wiring layer 213, thereby minimizing a problem caused by the parasitic capacitance in the wiring area WA.

In an exemplary embodiment of manufacturing a display apparatus, the display apparatus according to the exemplary embodiment in FIG. 3 may be manufactured by further performing a process of forming the second insulating layer 14 after the third mask process performed in the method of manufacturing the display apparatus described with reference to FIGS. 2A through 2I. In this regard, the first and second contact holes H1 and H2 may be formed to pass through the etch prevention layer 115 and the second insulating layer 14, and the third contact hole H3 may be formed to pass through the buffer layer 11, the first insulating layer 13 and the second insulating layer 14.

Figure 5:
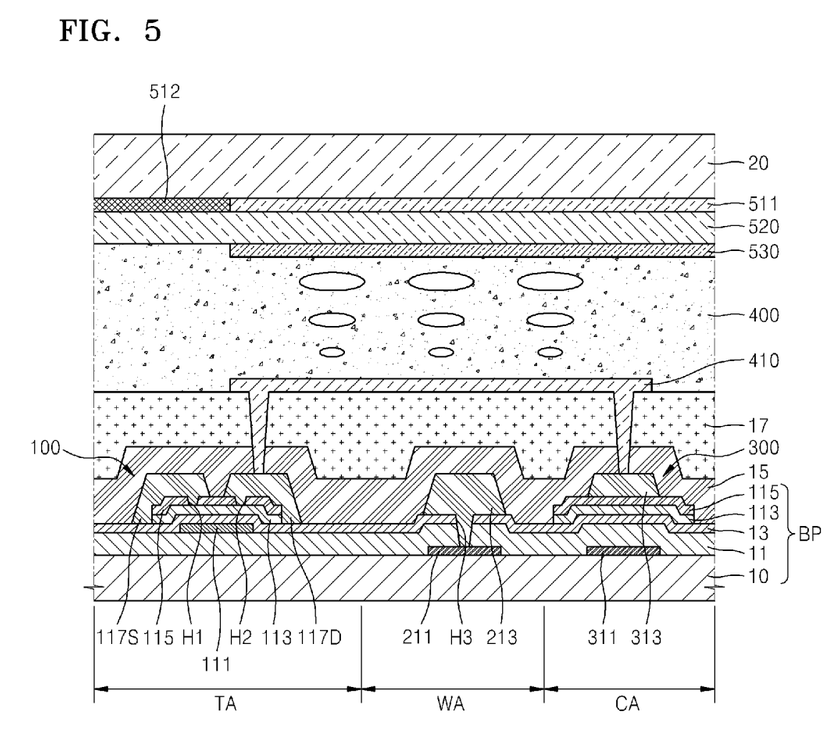
FIG. 5 is a cross-sectional view illustrating still another exemplary embodiment of a display apparatus, according to the invention.

FIG. 5 is a cross-sectional view illustrating still another exemplary embodiment of a display apparatus, according to the invention. The display apparatus according to the exemplary embodiment in FIG. 5 may include a liquid crystal display device disposed on the backplane panel BP. Like reference numerals between FIGS. 1 and 5 refer to like elements. Differences between the display apparatus of FIG. 5 and the display apparatus described with reference to FIG. 1 are described.

A liquid crystal layer 400 may be disposed between the substrate 10 and an upper substrate 20. In more detail, the liquid crystal layer 400 is disposed between a first pixel electrode 410 and a second pixel electrode 530, and shields or transmits light supplied from a light source (not shown) by adjusting orientation of liquid crystals therein when a voltage is applied to the first pixel electrode 410 and the second pixel electrode 530.

The first pixel electrode 410 may be disposed on the planarization layer 17. The first pixel electrode 410 may be physically and/or electrically coupled to the drain electrode 117D of the TFT 100 and the upper electrode 313 of the capacitor 300 through via holes that are defined to pass through the interlayer insulating layer 15 and the planarization layer 17. The first pixel electrode 410 may include a material having a relatively high work function such as ITO, IZO, ZNO or $In_2O_3$.

The upper substrate 20 may be a transparent substrate, similar the substrate 10. A color filter 511, a black matrix 512, an overcoat layer 520 and the second pixel electrode 530 may be disposed on the upper substrate 20.

The color filter 511 gives color to light that is radiated from the light source (not shown) and passes through the liquid crystal layer 400. The color filter 511 may include a photosensitive organic material. The black matrix 512 prevents color mixing and interference of visible rays implemented by passing through the color filter 511.

The overcoat layer 520 may be disposed on the color filter 511 and the black matrix 512. The overcoat layer 520 may include a material such as acryl based epoxy, and may protect the color filter 511.

The second pixel electrode 530 may be disposed on the overcoat layer 520. The second pixel electrode 530 may include a transparent conductive material such as ITO or IZO. The second pixel electrode 530 and the first pixel electrode 510 may directly apply voltage to the liquid crystal layer 400.

In the illustrated exemplary embodiment of FIG. 5, the display apparatus includes the liquid crystal display device formed on the backplane panel BP having the structure of FIG. 1, but the invention is not limited thereto. According to another exemplary embodiment, the display apparatus of FIG. 5 may include the liquid crystal display device formed on the backplane panel BP' described with reference to FIG. 3.

As described above, according to one or more of the above-described exemplary embodiments of the invention, a display apparatus and a method of manufacturing the display apparatus may increase reliability of a TFT.

It should be understood that the exemplary embodiments described herein should be considered in a descriptive sense only and not for purposes of limitation. Descriptions of features within each exemplary embodiment should typically be considered as available for other similar features in other exemplary embodiments.

While one or more exemplary embodiment of the invention have been described with reference to the figures, it will be understood by those of ordinary skill in the art that various changes in form and details may be made therein without departing from the spirit and scope of the invention as defined by the following claims.

What is claimed is:

1. A display apparatus comprising:
a backplane panel comprising:
a substrate on which are defined a transistor area and a wiring area;
a thin film transistor in the transistor area of the substrate, and comprising a gate electrode, an active layer, a source electrode and a drain electrode;
an etch prevention layer which is in the transistor area and absent in the wiring area, and covers the active layer, and first and second contact holes defined in the etch prevention layer in the transistor area and through which the active layer is electrically coupled to the source electrode and the drain electrode, respectively;
a first wiring layer in the wiring area of the substrate, the first wiring layer in the wiring area and the gate electrode in the transistor area in different layers;
a first insulating layer which is on the substrate and covers the gate electrode and the first wiring layer, and a third contact hole which is defined in the first insulating layer in the wiring area and exposes the first wiring layer;
a second wiring layer which is on the first insulating layer and in the wiring area of the substrate, and electrically coupled to the first wiring layer via the third contact hole, and
a buffer layer which is on the substrate, between the substrate and the gate electrode in the transistor area, the buffer layer extended to cover the first wiring layer in the wiring area.

2. The display apparatus of claim 1, wherein the etch prevention layer has the same pattern as that of the active layer.

3. The display apparatus of claim 1, wherein the etch prevention layer is directly on the active layer.

4. The display apparatus of claim 1, wherein the second wiring layer is directly on the first insulating layer.

5. The display apparatus of claim 1, further comprising a second insulating layer between the first insulating layer and the second wiring layer.

6. The display apparatus of claim 1, wherein the second wiring layer comprises a same material as that of the source electrode and the drain electrode.

7. The display apparatus of claim 1, further comprising:
a pixel electrode electrically coupled to the source electrode or the drain electrode;
an intermediate layer on the pixel electrode and comprising an organic emission layer; and
a counterpart electrode on the intermediate layer.

8. The display apparatus of claim 1, further comprising:
a first pixel electrode electrically coupled to the source electrode or the drain electrode;
a liquid crystal layer on the first pixel electrode; and
a second pixel electrode on the liquid crystal layer and facing the first pixel electrode.

9. The display apparatus of claim 1, wherein the active layer comprises an oxide semiconductor.

10. A method of manufacturing a display apparatus comprising:
providing a backplane panel, comprising:
forming a first wiring layer in a wiring area of a substrate;
forming a buffer layer to cover the first wiring layer in the wiring area
forming a gate electrode on the buffer layer in a transistor area of the substrate, the first wiring layer in the wiring area and the gate electrode in the transistor area in different layers;
forming a first insulating layer, a semiconductor layer and an etch prevention material layer to cover the gate electrode and the first wiring layer;
etching the semiconductor layer and the etch prevention material layer in the wiring area, to form an active layer and an etch prevention layer on the gate electrode in the transistor area;
simultaneously forming first and second contact holes in the etch prevention layer in the transistor area by patterning the etch prevention layer on the gate electrode, and a third contact hole in the first insulating layer in the wiring area by patterning the first insulating layer on the first wiring layer; and
forming a source electrode and a drain electrode in the transistor area, and a second wiring layer in the wiring area, by forming and patterning a metal layer.

11. The method of claim 10, wherein the etching the semiconductor layer and the etch prevention material layer comprises:
forming the active layer by removing the semiconductor layer in the wiring area, while maintaining the semiconductor layer on the gate electrode in the transistor area, and
forming the etch prevention layer by removing the etch prevention material layer in the wiring area, while maintaining the etch prevention material layer on the gate electrode in the transistor area.

12. The method of claim 11, wherein the semiconductor layer and the etch prevention material layer are simultaneously etched so that the active layer and the etch prevention layer have the same pattern.

13. The method of claim 10, wherein the simultaneously forming the first through third contact holes comprises:
forming the first and second contact holes by patterning the etch prevention layer on the gate electrode, and
forming the third contact hole by patterning the buffer layer and the first insulating layer on the first wiring layer.

14. The method of claim 10, further comprising forming a second insulating layer to cover the etch prevention layer of the transistor area and the first insulating layer of the wiring area.

15. The method of claim 10, wherein the semiconductor layer comprises an oxide semiconductor.

16. The method of claim 10, further comprising forming a second insulating layer on the substrate.

17. The method of claim 16, wherein, in the simultaneously forming the first through third contact holes,
the first and second contact holes are formed to pass through the etch prevention layer and the second insulating layer on the gate electrode, and
the third contact hole is formed to pass through the first and second insulating layers on the first wiring layer.

* * * * *